US012804891B2

(12) United States Patent
Varghese et al.

(10) Patent No.: US 12,804,891 B2
(45) Date of Patent: Nov. 17, 2026

(54) DYNAMIC RANDOM ACCESS MEMORY (DRAM) STORAGE NODE CONTACT

(71) Applicant: Applied Materials, Inc., Santa Clara, CA (US)

(72) Inventors: Sony Varghese, Manchester, MA (US); Tong Liu, San Jose, CA (US); Zhijun Chen, San Jose, CA (US); Balasubramanian Pranatharthiharan, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 360 days.

(21) Appl. No.: 18/608,917

(22) Filed: Mar. 18, 2024

(65) Prior Publication Data

US 2024/0341090 A1 Oct. 10, 2024

Related U.S. Application Data

(60) Provisional application No. 63/458,293, filed on Apr. 10, 2023.

(51) Int. Cl.
*H10B 12/00* (2023.01)

(52) U.S. Cl.
CPC ....... *H10B 12/485* (2023.02); *H10B 12/0335* (2023.02); *H10B 12/315* (2023.02); *H10B 12/482* (2023.02)

(58) Field of Classification Search
None
See application file for complete search history.

(56) References Cited

U.S. PATENT DOCUMENTS

2002/0008324 A1* 1/2002 Shinkawata ......... H10B 12/053 257/E21.507
2006/0205141 A1 9/2006 Park et al.
2012/0020143 A1 1/2012 Lambertson et al.
2020/0020697 A1* 1/2020 Kim ................... H10B 12/0335
2020/0203353 A1* 6/2020 Liu ...................... H10B 12/315
2021/0265357 A1 8/2021 Varghese et al.
2022/0005812 A1 1/2022 Varghese
2022/0336469 A1 10/2022 Breil et al.

OTHER PUBLICATIONS

International Search Report and Written Opinion dated Jul. 5, 2024 for Application No. PCT/US2024/020355.

* cited by examiner

*Primary Examiner* — Bo B Jang
(74) *Attorney, Agent, or Firm* — Patterson + Sheridan, LLP

(57) ABSTRACT

A semiconductor structure includes a first active region and a second active region on a substrate, a metal plug electrically connected to the first active region via a contact layer and an interface layer, a bit line electrically connected to the second active region via a bit line contact plug, and a bit line spacer encapsulating the bit line, wherein the first active region and the second active region are lightly n-type doped, the substrate is p-type doped, and the contact layer is epitaxially grown and n-type doped with a graded doping profile that increases from an interface with the first active region to an interface with the interface layer.

17 Claims, 7 Drawing Sheets

DYNAMIC RANDOM ACCESS MEMORY (DRAM) STORAGE NODE CONTACT

CROSS-REFERENCE TO RELATED APPLICATIONS

This application claims priority to U.S. Provisional Application Ser. No. 63/458,293 filed Apr. 10, 2023, which is herein incorporated by reference in its entirety.

BACKGROUND

Field

Embodiments described herein generally relate to semiconductor device fabrication, and more particularly, to systems and methods of forming storage node contacts in dynamic random-access memory devices.

Description of the Related Art

In dynamic random-access memory (DRAM) devices, each memory cell includes a storage capacitor and a field-effect transistor (FET) device that needs to be connected to a bit line, with a low bit line capacitance, and a storage node of the storage capacitor, with a low resistance for high DRAM sense margin and high driving capability of the FET device. However, resistance of a storage node contact (SNC) that connects the FET device to the storage node of the storage capacitor increases due to device scaling, especially as resistance of a polysilicon plug portion of the SNC increases. Further, a thick bit line spacer that leads to a low bit line capacitance causes high resistance due to either a narrow bit line or a narrow storage node contact due to physical constraints in small sizes. Thus, various ultra-low resistivity bit line conductive materials and ultra-low dielectric constant spacer materials have been explored, but no materials have found that meet the requirement of future DRAM.

Thus, there is a need for systems and methods that can fabricate a storage node contact and a bit line spacer that lead to a low resistance of the storage node contact and a low bit line capacitance in a DRAM device.

SUMMARY

Embodiments of the present disclosure provide a semiconductor structure. The semiconductor structure includes a first active region and a second active region on a substrate, a metal plug electrically connected to the first active region via a contact layer and an interface layer, a bit line electrically connected to the second active region via a bit line contact plug, and a bit line spacer encapsulating the bit line, wherein the first active region and the second active region are lightly n-type doped, the substrate is p-type doped, and the contact layer is epitaxially grown and n-type doped with a graded doping profile that increases from an interface with the first active region to an interface with the interface layer.

Embodiments of the present disclosure also provide a method of forming a storage node contact in a semiconductor device. The method includes performing a first deposition process to form a contact layer on an exposed surface of an active region within a storage node contact hole formed within a spacer, wherein a doping concentration of the contact layer is increased from an interface with the active region to a top surface of the contact layer, performing a second deposition process to form an interface layer on the top surface of the contact layer, performing a metal fill process to fill the storage node contact hole with a metal fill material and deposit the metal fill material over the interface layer, and performing a patterning process to pattern the deposited metal fill material, forming a metal plug that is electrically connected to the active region via the contact layer and the interface layer, and a landing pad overlapping with the metal plug.

Embodiments of the present disclosure further provide a dynamic random-access memory (DRAM) device. The DRAM device includes a plurality of memory cells, each of the plurality of memory cells including a bit line encapsulated in a bit line spacer, a storage capacitor, and an access transistor having a first active region electrically connected to a storage node of the storage capacitor via a storage node contact and a second active region electrically connected to the bit line, wherein the storage node contact includes an epitaxially grown contact layer n-type doped with a graded doping profile that increases from an interface with the first active region to a top surface of the contact layer, an interface layer in contact with the top surface of the contact layer, a metal plug in contact with the interface layer, and a landing pad in contact with the metal plug and the storage node of the storage capacitor.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

Figure 1:
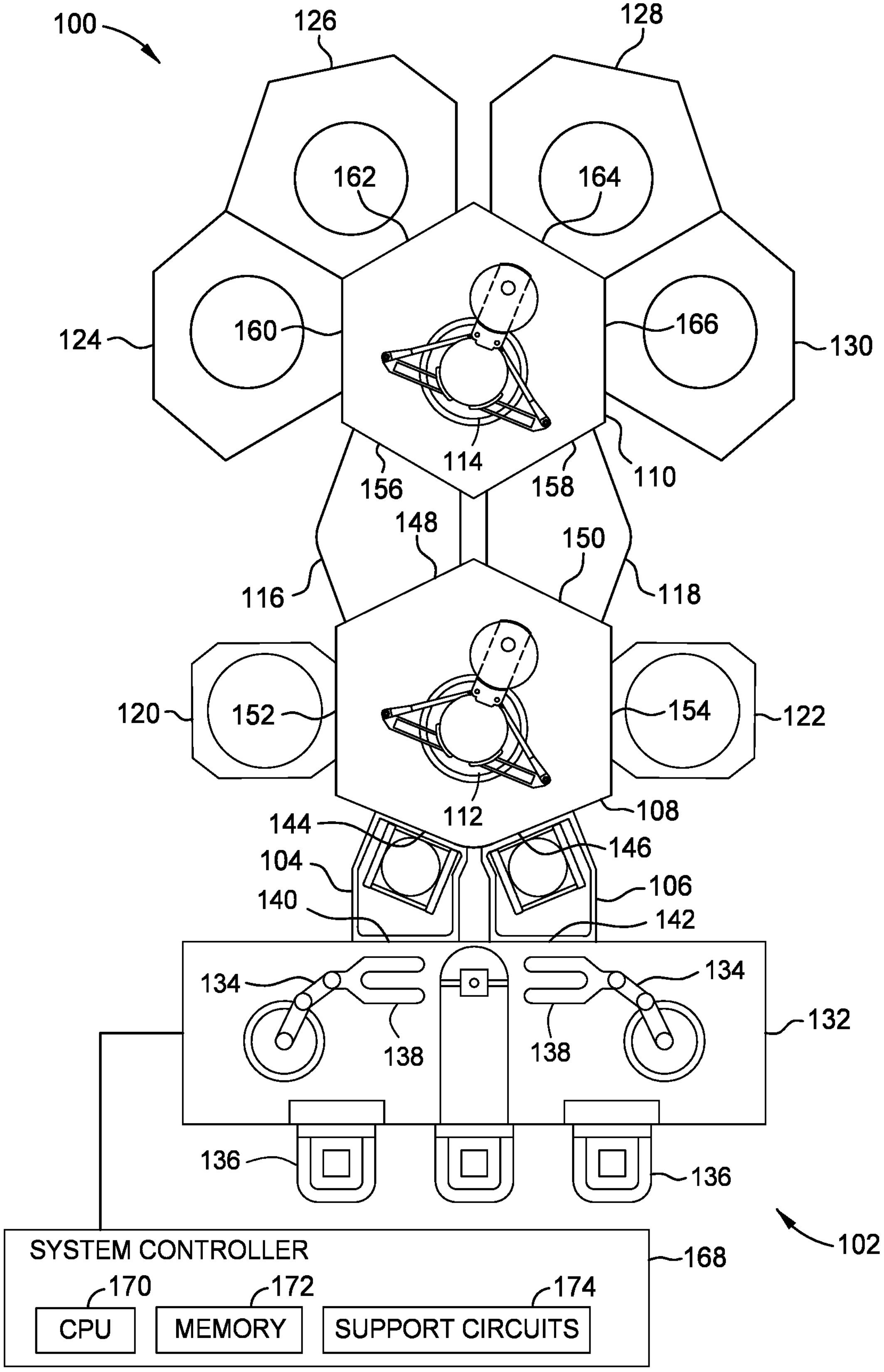
FIG. 1 is a schematic top view of a multi-chamber processing system according to one or more embodiments of the present disclosure.

To facilitate understanding, identical reference numerals have been used, where possible, to designate identical elements that are common to the figures. It is contemplated that elements and features of one embodiment may be beneficially incorporated in other embodiments without further recitation. In the figures and the following description, an orthogonal coordinate system including an X-axis, a Y-axis, and a Z-axis is used. The directions represented by the arrows in the drawing are assumed to be positive directions for convenience.

DETAILED DESCRIPTION

The embodiments described herein provide systems and methods for forming transistor devices for extremely scaled process nodes, such as DRAM devices with bit lines and memory cell arrays. Each memory cell includes an access transistor, a storage capacitor, and a storage node contact that connects a storage node of the storage capacitor to the storage node side of the access transistor. A storage node contact according to the embodiments described herein is formed of an epitaxially grown doped silicon and a metal plug and includes a dielectric spacer around the storage node contact to lower a bit line capacitance. Thus, low resistance in the storage node contact and low bit line capacitance can be achieved.

FIG. 1 is a schematic top view of a multi-chamber processing system 100, according to one or more embodiments of the present disclosure. The processing system 100 generally includes a factory interface 102, load lock chambers 104, 106, transfer chambers 108, 110 with respective transfer robots 112, 114, holding chambers 116, 118, and processing chambers 120, 122, 124, 126, 128, 130. As detailed herein, substrates in the processing system 100 can be processed in and transferred between the various chambers without exposing the substrates to an ambient environment exterior to the processing system 100 (e.g., an atmospheric ambient environment such as may be present in a fab). For example, the substrates can be processed in and transferred between the various chambers maintained at a low pressure (e.g., less than or equal to about 300 Torr) or vacuum environment without breaking the low pressure or vacuum environment among various processes performed on the substrates in the processing system 100. Accordingly, the processing system 100 may provide for an integrated solution for some processing of substrates.

Examples of a processing system that may be suitably modified in accordance with the teachings provided herein include the Endura®, Producer® or Centura® integrated processing systems or other suitable processing systems commercially available from Applied Materials, Inc., located in Santa Clara, California. It is contemplated that other processing systems (including those from other manufacturers) may be adapted to benefit from aspects described herein.

In the illustrated example of FIG. 1, the factory interface 102 includes a docking station 132 and factory interface robots 134 to facilitate transfer of substrates. The docking station 132 is adapted to accept one or more front opening unified pods (FOUPs) 136. In some examples, each factory interface robot 134 generally includes a blade 138 disposed on one end of the respective factory interface robot 134 adapted to transfer the substrates from the factory interface 102 to the load lock chambers 104, 106.

The load lock chambers 104, 106 have respective ports 140, 142 coupled to the factory interface 102 and respective ports 144, 146 coupled to the transfer chamber 108. The transfer chamber 108 further has respective ports 148, 150 coupled to the holding chambers 116, 118 and respective ports 152, 154 coupled to processing chambers 120, 122. Similarly, the transfer chamber 110 has respective ports 156, 158 coupled to the holding chambers 116, 118 and respective ports 160, 162, 164, 166 coupled to processing chambers 124, 126, 128, 130. The ports 144, 146, 148, 150, 152, 154, 156, 158, 160, 162, 164, 166 can be, for example, slit valve openings with slit valves for passing substrates therethrough by the transfer robots 112, 114 and for providing a seal between respective chambers to prevent a gas from passing between the respective chambers. Generally, any port is open for transferring a substrate therethrough. Otherwise, the port is closed.

The load lock chambers 104, 106, transfer chambers 108, 110, holding chambers 116, 118, and processing chambers 120, 122, 124, 126, 128, 130 may be fluidly coupled to a gas and pressure control system (not specifically illustrated). The gas and pressure control system can include one or more gas pumps (e.g., turbo pumps, cryo-pumps, roughing pumps), gas sources, various valves, and conduits fluidly coupled to the various chambers. In operation, a factory interface robot 134 transfers a substrate from a FOUP 136 through a port 140 or 142 to a load lock chamber 104 or 106. The gas and pressure control system then pumps down the load lock chamber 104 or 106. The gas and pressure control system further maintains the transfer chambers 108, 110 and holding chambers 116, 118 with an interior low pressure or vacuum environment (which may include an inert gas). Hence, the pumping down of the load lock chamber 104 or 106 facilitates passing the substrate between, for example, the atmospheric environment of the factory interface 102 and the low pressure or vacuum environment of the transfer chamber 108.

With the substrate in the load lock chamber 104 or 106 that has been pumped down, the transfer robot 112 transfers the substrate from the load lock chamber 104 or 106 into the transfer chamber 108 through the port 144 or 146. The transfer robot 112 is then capable of transferring the substrate to and/or between any of the processing chambers 120, 122 through the respective ports 152, 154 for processing and the holding chambers 116, 118 through the respective ports 148, 150 for holding to await further transfer. Similarly, the transfer robot 114 is capable of accessing the substrate in the holding chamber 116 or 118 through the port 156 or 158 and is capable of transferring the substrate to and/or between any of the processing chambers 124, 126, 128, 130 through the respective ports 160, 162, 164, 166 for processing and the holding chambers 116, 118 through the respective ports 156, 158 for holding to await further transfer. The transfer and holding of the substrate within and among the various chambers can be in the low pressure or vacuum environment provided by the gas and pressure control system.

The processing chambers 120, 122, 124, 126, 128, 130 can be any appropriate chamber for processing a substrate. In some examples, the processing chamber 120 can be capable of performing an etch process, the processing chamber 122 can be capable of performing a cleaning process, the processing chamber 124 can be capable of performing a selective removal process, and the processing chambers 126, 128, 130 can be capable of performing respective epitaxial growth processes. The processing chamber 120 may be a Selectra™ Etch chamber available from Applied Materials of Santa Clara, Calif. The processing chamber 122 may be a SiCoNi™ Pre-clean chamber available from Applied Materials of Santa Clara, Calif. The processing chamber 126, 128, or 130 may be a Centura™ Epi chamber available from Applied Materials of Santa Clara, Calif.

A system controller 168 is coupled to the processing system 100 for controlling the processing system 100 or components thereof. For example, the system controller 168 may control the operation of the processing system 100 using a direct control of the chambers 104, 106, 108, 110, 116, 118, 120, 122, 124, 126, 128, 130 of the processing system 100 or by controlling controllers associated with the chambers 104, 106, 108, 110, 116, 118, 120, 122, 124, 126, 128, 130. In operation, the system controller 168 enables data collection and feedback from the respective chambers to coordinate performance of the processing system 100.

The system controller 168 generally includes a central processing unit (CPU) 170, memory 172, and support circuits 174. The CPU 170 may be one of any form of a general purpose processor that can be used in an industrial setting. The memory 172, or non-transitory computer-readable medium, is accessible by the CPU 170 and may be one or more of memory such as random access memory (RAM), read only memory (ROM), floppy disk, hard disk, or any other form of digital storage, local or remote. The support circuits 174 are coupled to the CPU 170 and may comprise cache, clock circuits, input/output subsystems, power supplies, and the like. The various methods disclosed herein may generally be implemented under the control of the CPU 170 by the CPU 170 executing computer instruction code stored in the memory 172 (or in memory of a particular processing chamber) as, for example, a software routine. When the computer instruction code is executed by the CPU 170, the CPU 170 controls the chambers to perform processes in accordance with the various methods.

Other processing systems can be in other configurations. For example, more or fewer processing chambers may be coupled to a transfer apparatus. In the illustrated example, the transfer apparatus includes the transfer chambers 108, 110 and the holding chambers 116, 118. In other examples, more or fewer transfer chambers (e.g., one transfer chamber) and/or more or fewer holding chambers (e.g., no holding chambers) may be implemented as a transfer apparatus in a processing system.

Figure 2:
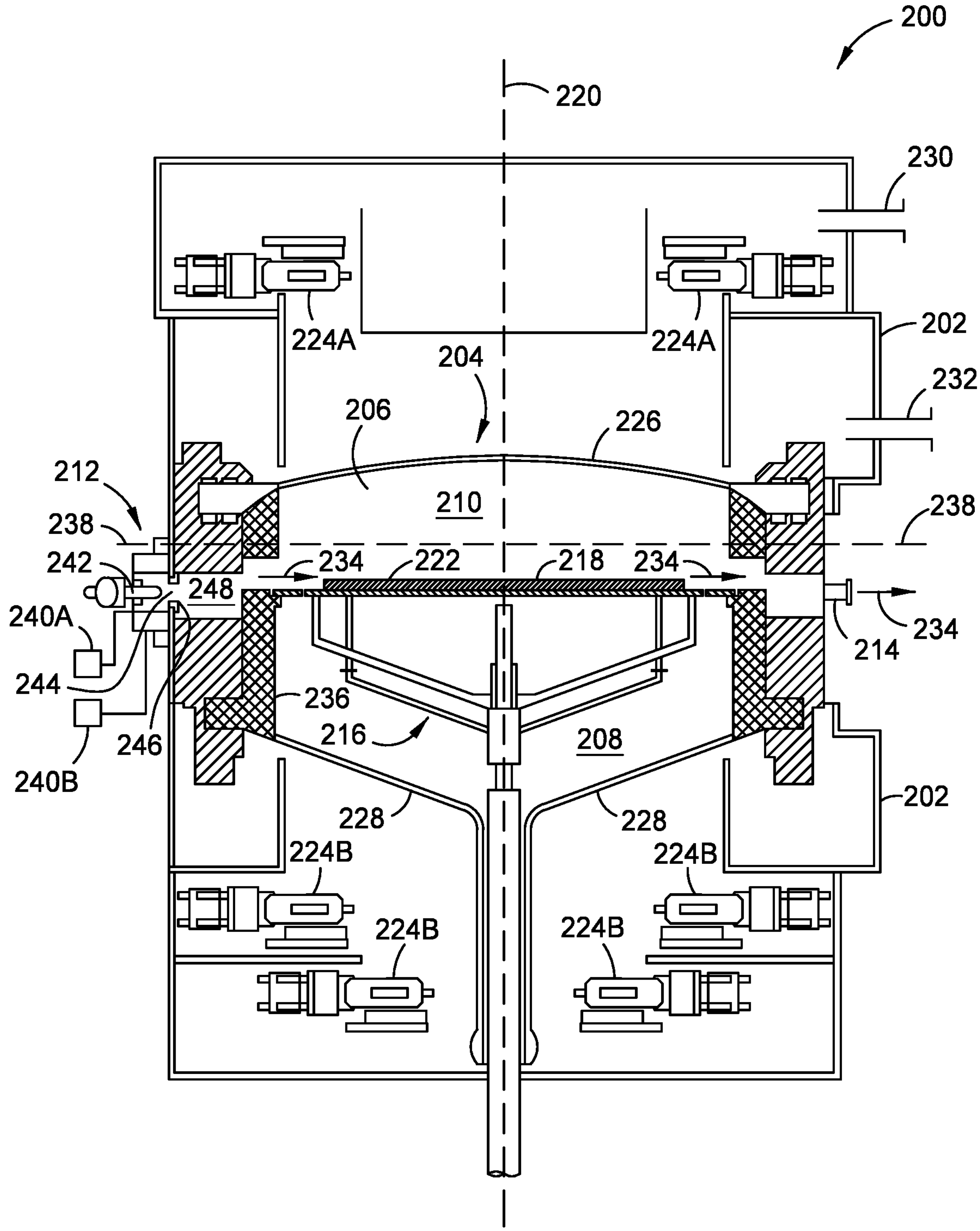
FIG. 2 is a cross sectional view of a processing chamber, according to one or more embodiments.

FIG. 2 is a cross sectional view of a processing chamber 200, according to one or more embodiments, that is adapted to perform an epitaxial (Epi) deposition process as detailed below. The processing chamber 200 may be the processing chamber 126, 128, or 130 shown in FIG. 1.

The processing chamber 200 includes a housing structure 202 made of a process resistant material, such as aluminum or stainless steel, for example 216L stainless steel. The housing structure 202 encloses various functioning elements of the processing chamber 200, such as a quartz chamber 204, which includes an upper quartz chamber 206, and a lower quartz chamber 208, in which a processing volume 210 is contained. Reactive species are provided to the quartz chamber 204 by a gas distribution assembly 212, and processing byproducts are removed from the processing volume 210 by an outlet port 214, which is typically in communication with a vacuum source (not shown).

A substrate support 216 is adapted to receive a substrate 218 that is transferred to the processing volume 210. The substrate support 216 is disposed along a longitudinal axis 220 of the processing chamber 200. The substrate support 216 may be made of a ceramic material or a graphite material coated with a silicon material, such as silicon carbide, or other process resistant material. Reactive species from precursor reactant materials are applied to a surface 222 of the substrate 218, and byproducts may be subsequently removed from the surface 222 of the substrate 218. Heating of the substrate 218 and/or the processing volume 210 may be provided by radiation sources, such as upper lamp modules 224A and lower lamp modules 224B.

In one embodiment, the upper lamp modules 224A and the lower lamp modules 224B are infrared (IR) lamps. Non-thermal energy or radiation from the lamp modules 224A and 224B travels through an upper quartz window 226 of the upper quartz chamber 206, and through a lower quartz window 228 of the lower quartz chamber 208. Cooling gases for the upper quartz chamber 206, if needed, enter through an inlet 230 and exit through an outlet 232. Precursor reactant materials, as well as diluent, purge and vent gases for the processing chamber 200, enter through the gas distribution assembly 212 and exit through the outlet port 214. While the upper quartz window 226 is shown as being curved or convex, the upper quartz window 226 may be planar or concave as the pressure on both sides of the upper quartz window 226 is substantially the same (i.e., atmospheric pressure).

The low wavelength radiation in the processing volume 210, which is used to energize reactive species and assist in adsorption of reactants and desorption of process byproducts from the surface 222 of the substrate 218, typically ranges from about 0.8 μm to about 1.2 μm, for example, between about 0.95 μm to about 1.05 μm, with combinations of various wavelengths being provided, depending, for example, on the composition of the film which is being epitaxially grown.

The component gases enter the processing volume 210 via the gas distribution assembly 212. Gas flows from the gas distribution assembly 212 and exits through the outlet port 214 as shown generally by a flow path 234. Combinations of component gases, which are used to clean/passivate a substrate surface, or to form the silicon and/or germanium-containing film that is being epitaxially grown, are typically mixed prior to entry into the processing volume 210. The overall pressure in the processing volume 210 may be adjusted by a valve (not shown) on the outlet port 214. At least a portion of the interior surface of the processing volume 210 is covered by a liner 236. In one embodiment, the liner 236 comprises a quartz material that is opaque. In this manner, the chamber wall is insulated from the heat in the processing volume 210.

The temperature of surfaces in the processing volume 210 may be controlled within a temperature range of about 200° C. to about 600° C., or greater, by the flow of a cooling gas, which enters through the inlet 230 and exits through the outlet 232, in combination with radiation from the upper lamp modules 224A positioned above the upper quartz window 226. The temperature in the lower quartz chamber 208 may be controlled within a temperature range of about 200° C. to about 600° C. or greater, by adjusting the speed of a blower unit which is not shown, and by radiation from the lower lamp modules 224B disposed below the lower quartz chamber 208. The pressure in the processing volume 210 may be between about 0.1 Torr to about 600 Torr, such as between about 5 Torr to about 30 Torr.

The temperature on the surface 222 of the substrate 218 may be controlled by power adjustment to the lower lamp modules 224B in the lower quartz chamber 208, or by power adjustment to both the upper lamp modules 224A overlying the upper quartz window 226, and the lower lamp modules 224B in the lower quartz chamber 208. The power density in the processing volume 210 may be between about 40 $W/cm^2$ to about 400 $W/cm^2$, such as about 80 $W/cm^2$ to about 120 $W/cm^2$.

In one aspect, the gas distribution assembly 212 is disposed normal to, or in a radial direction 238 relative to, the longitudinal axis 220 of the processing chamber 200 or the substrate 218. In this orientation, the gas distribution assembly 212 is adapted to flow process gases in the radial direction 238 across, or parallel to, the surface 222 of the substrate 218. In one processing application, the process gases are preheated at the point of introduction to the processing chamber 200 to initiate preheating of the gases prior to introduction to the processing volume 210, and/or to break specific bonds in the gases. In this manner, surface reaction kinetics may be modified independently from the thermal temperature of the substrate 218.

In operation, precursors used to form silicon (Si) and silicon germanium (SiGe) blanket or selective epitaxial films are provided to the gas distribution assembly 212 from one or more gas sources 240A and 240B. IR lamps 242 (only one is shown in FIG. 2) may be utilized to heat the precursors within the gas distribution assembly 212 as well as along the flow path 234. The gas sources 240A, 240B may be coupled the gas distribution assembly 212 in a manner adapted to facilitate introduction zones within the gas distribution assembly 212, such as a radial outer zone and a radial inner zone between the outer zones when viewed in from a top plan view. The gas sources 240A, 240B may include valves (not shown) to control the rate of introduction into the zones.

The gas sources 240A, 240B may include silicon precursors such as silanes, including silane ($SiH_4$), disilane ($Si_2H_6$), dichlorosilane ($SiH_2Cl_2$), hexachlorodisilane ($Si_2Cl_6$), dibromosilane ($SiH_2Br_2$), higher order silanes, derivatives thereof, and combinations thereof. The gas sources 240A, 240B may also include germanium containing precursors, such as germane ($GeH_4$), digermane ($Ge_2H_6$), germanium tetrachloride ($GeCl_4$), dichlorogermane ($GeH_2Cl_2$), derivatives thereof, and combinations thereof. The silicon and/or germanium containing precursors may be used in combination with hydrogen chloride (HCl), chlorine gas ($Cl_2$), hydrogen bromide (HBr), and combinations thereof. The gas sources 240A, 240B may include one or more of the silicon and germanium containing precursors in one or both of the gas sources 240A, 240B.

The precursor materials enter the processing volume 210 through openings or holes 244 (only one is shown in FIG. 2) in a perforated plate 246 in this excited state, which in one embodiment is a quartz material, having the holes 244 formed therethrough. The perforated plate 246 is transparent to IR energy, and may be made of a clear quartz material. In other embodiments, the perforated plate 246 may be any material that is transparent to IR energy and is resistant to process chemistry and other processing chemistries. The energized precursor materials flow toward the processing volume 210 through the holes 244 in the perforated plate 246, and through channels 248 (only one is shown in FIG. 2). A portion of the photons and non-thermal energy from the IR lamps 242 also passes through the holes 244, the perforated plate 246, and channels 248 facilitated by a reflective material and/or surface disposed on the interior surfaces of the gas distribution assembly 212, thereby illuminating the flow path 234 of the precursor materials. In this manner, the vibrational energy of the precursor materials may be maintained from the point of introduction to the processing volume 210 along the flow path.

Figure 3A:
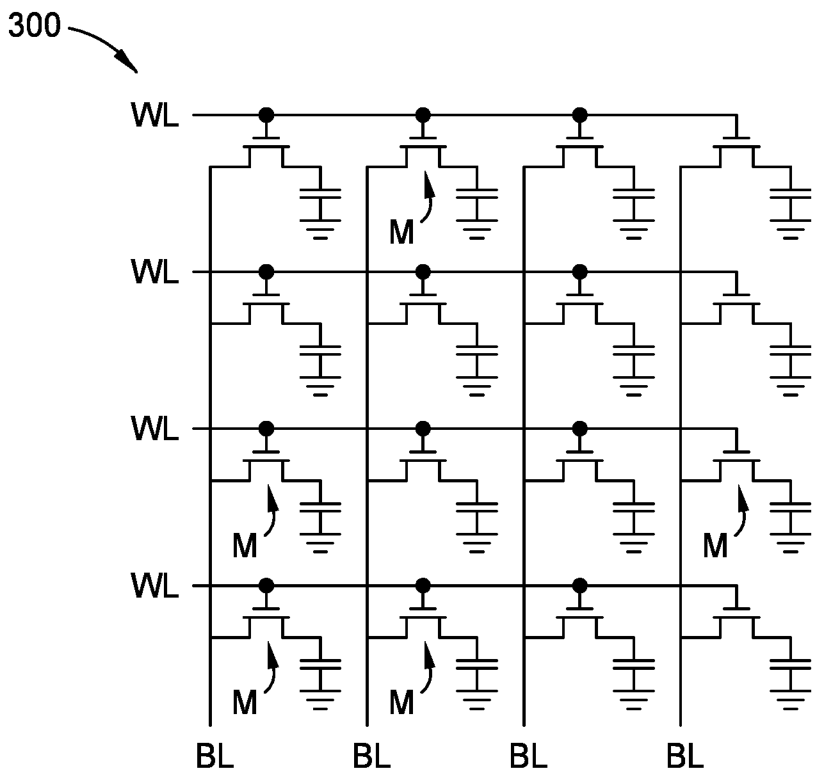
FIG. 3A is a schematic diagram of a portion of a memory cell array of dynamic random access memory (DRAM) cells according to one embodiment.

FIG. 3A is a schematic diagram of a portion of a memory cell array 300 of dynamic random access memory (DRAM) cells (also referred to as "memory cells") M, according to one or more embodiments of the present disclosure.

Figure 3B:
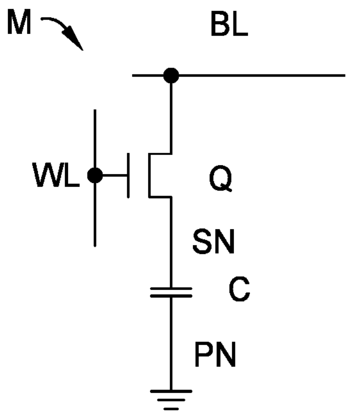
FIG. 3B is a schematic diagram of a DRAM cell.

As shown in FIG. 3B, a single memory cell M includes an access transistor Q and a storage capacitor C. The memory cell M stores a datum bit by storing a packet of charge (i.e., a binary one) or no charge (i.e., a binary zero) on a storage node (SN) of the storage capacitor C. A plate node (PN) of the storage capacitor C may be grounded. A datum bit is input and output by a bit line BL that is connected to the source terminal of the access transistor Q, and input is controlled by a word line WL that is connected to the gate of the access transistor Q.

In the memory cell array 300, each of bit lines BL is linked to the sources/drains of access transistors Q and each of word lines WL is linked to the gates of the access transistors Q.

Figure 4B:
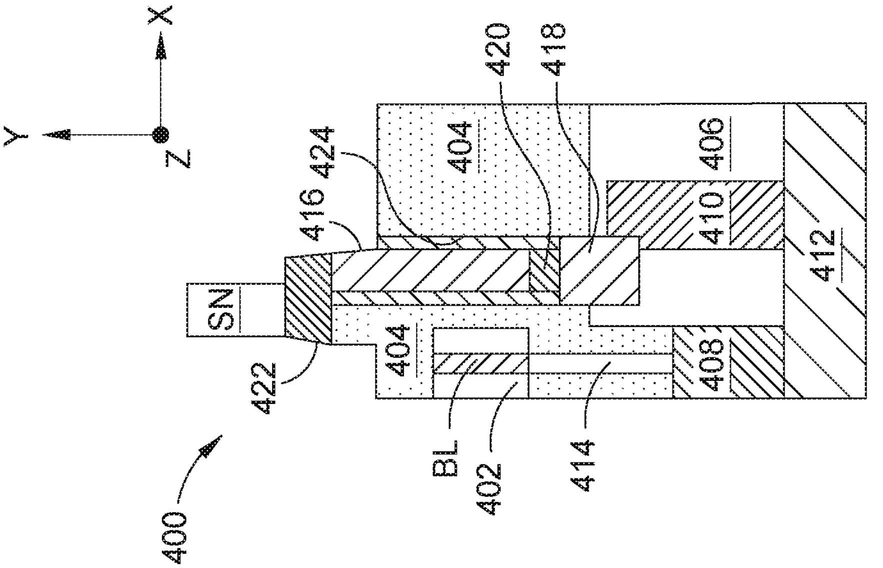
FIG. 4B is a cross-sectional view of the semiconductor structure of FIG. 4A along the line A-A' shown in FIG. 4A.
Figure 4A:
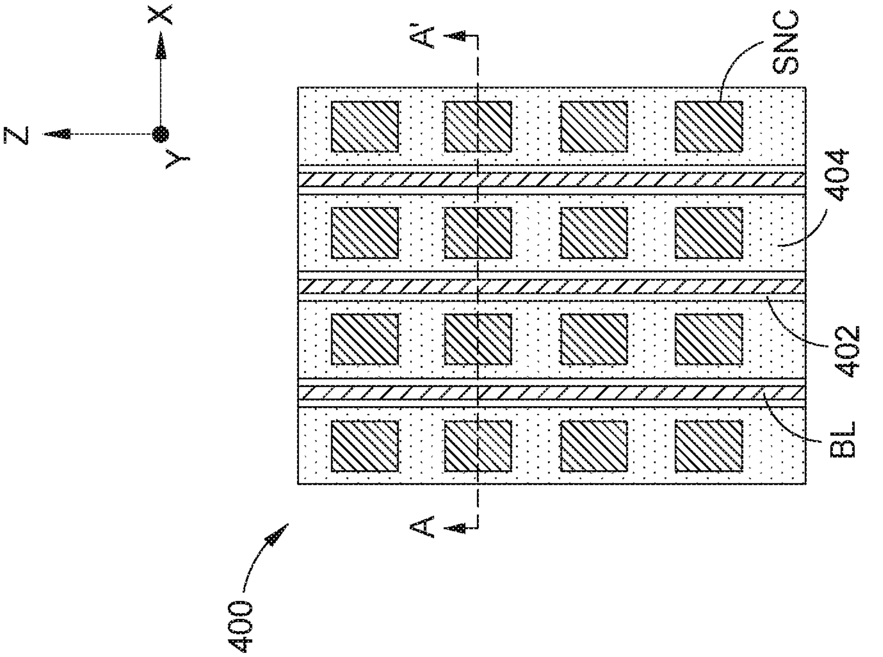
FIG. 4A is a cross-sectional view of a portion of a semiconductor structure.

FIG. 4A is a cross-sectional view of a portion of a semiconductor structure 400 that may form a memory cell array, such as a portion of the memory cell array 300. FIG. 4B is a cross-sectional view of the semiconductor structure 400 along the line A-A' shown in FIG. 4A.

The semiconductor structure 400 includes bit lines BL embedded within an insulating layer 402 and extending in the Z direction that are encapsulated by a bit line spacer 404. In-between the bit lines BL, storage node contacts SNC are disposed to connect the storage node SN of each storage capacitor C to the drain terminal (on the storage node side) of the respective access transistor Q in the memory cells M.

The bit lines BL may be formed of metal such as copper (Cu), cobalt (Co), tungsten (W), titanium (Ti), molybdenum (Mo), nickel (Ni), ruthenium (Ru), silver (Ag), gold (Au), iridium (Ir), tantalum (Ta), platinum (Pt), titanium silicide ($TiSi_2$), tungsten silicide ($WSi_2$), conductive oxides or nitrides thereof, or any combination thereof, with a width of between about 5 nm and about 10 nm.

The bit line spacers 404 may be formed of dielectric material, such as silicon nitride ($Si_3N_4$), silicon oxynitride (SiON), boron-nitride (BN), silicon oxycarbide (SiOCN), boron-doped silicon oxycarbonitride (SiOCBN), aluminum oxide ($Al_2O_3$), silicon carbonitride (SiCN), silicon boronitride (SiBN), zirconium oxide ($ZrO_2$), hafnium oxide ($HfO_2$), or any combination thereof.

The bit lines BL may have a width of between about 5 nm and about 10 nm and spaced from one another by the bit line spacers 404 having a width of between about 20 nm and about 30 nm in the X direction.

The insulating layer 402 may be formed of dielectric material, such as silicon oxide ($SiO_2$), silicon oxynitride (SiON), silicon oxycarbide (SiOC), silicon oxycarbonitride (SiOCN), silicon carbonitride (SiCN), silicon boronitride (SiBN), or any combination thereof.

Referring to FIG. 4B, the semiconductor structure 400 includes an insulating layer 406 and active regions 408 and 410 formed on a substrate 412. The substrate 412 may be p-type doped silicon. The active regions 408 and 410 are lightly n-type doped silicon regions and isolated from each other by the insulating layer 406. The active region 408, the substrate 412, and another active region 410 aligned in the Z direction (not shown) form an access transistor Q in a memory cell M. The bit line BL is electrically connected to the active region 408 via a bit line contact plug 414 formed through a bit line spacer 404. A metal plug 416 is electrically connected to the active region 410 via a contact layer 418 and an interface layer 420 and to a storage node SN of a storage capacitor C in the memory cell M. A landing pad 422 may overlap with the metal plug 416 and the storage node SN so as to increase a contact area between the metal plug 416 and the storage node SN of the storage capacitor C. The metal plug 416, the contact layer 418, the interface layer 420, and the landing pad 422 form a storage node contact (SNC) that connects the storage node side of the access transistor Q and the storage node SN of the storage capacitor C in the memory cell M. It should be noted that a storage node contact SNC is conventionally formed with a polysilicon plug that has higher resistivity, even heavily doped, than a metal plug, such as the metal plug 416. Thus, the storage node contact SNC including the metal plug 416 may have lower resistance than a conventional storage node contact including a polysilicon plug.

The insulating layer 406 may be formed of dielectric material, such as silicon oxide ($SiO_2$), silicon oxynitride (SiON), silicon oxycarbide (SiOC), silicon oxycarbonitride (SiOCN), silicon carbonitride (SiCN), silicon boronitride (SiBN), or any combination thereof. The active regions 408 and 410 may be lightly doped with n-type dopants, such as phosphorus (P), arsenic (As), or antimony (Sb), with the concentration of between about $10^{16}$ $cm^{-3}$ and about $10^{19}$ $cm^{-3}$. The substrate 412 may be a silicon based material such as crystalline silicon (e.g., Si<100> or Si<111>), strained silicon, silicon germanium, polycrystalline silicon, silicon wafers and patterned or non-patterned wafers, or silicon on insulator (SOI). The bit line contact plug 414 may be formed of doped polysilicon or other conductive material. The metal plug 416 and the landing pad 422 may be formed of conductive material, such as tungsten (W), copper (Cu), cobalt (Co), titanium (Ti), molybdenum (Mo), nickel (Ni), ruthenium (Ru), silver (Ag), gold (Au), iridium (Ir), tantalum (Ta), or platinum (Pt), or conductive oxides or nitrides thereof, or any combination thereof. The contact layer 418 is formed of epitaxially grown silicon heavily doped with n-type dopants such as phosphorus (P), arsenic (As), or antimony (Sb).

The contact layer 418 may have a thickness of between about 15 nm and about 30 nm and a graded doping profile that increases from between about $10^{16}$ $cm^{-3}$ and about $10^{19}$ $cm^{-3}$ at an interface with the active region 410 to between about $10^{19}$ $cm^{-3}$ and about $10^{20}$ $cm^{-3}$ at an interface with the interface layer 420. When the contact layer 418 is thinner and still heavily doped, the dopants partially diffuse into the lightly doped active region 410 and leakage current in the storage node side of the access transistor Q may increase. The contact layer 418 according to the embodiments described herein is relatively thick and doped with the graded doping profile, such that a lightly doped portion of the contact layer 418 is formed at an interface with the lightly doped active region 410 and subsequently a heavily doped portion of the contact layer 418 is formed on the lightly doped portion of the contact layer 418. Thus, a leakage current is suppressed, in combination with the use of the metal plug 416 (in place for a conventional polysilicon plug), leading to a lower resistance of the storage node contact SNC. Further, the low resistance of the storage node contact SNC enables a narrower metal plug 416, for example, with a thickness of between about 5 nm and about 12 nm, such that an inner spacer layer 424 can be inserted between the bit line spacer 404 and the metal plug 416. The inner spacer layer 424 adds thickness to the bit line spacer 404 and reduces a bit line capacitance in a DRAM device. The inner spacer layer 424 may be formed of dielectric material, such as silicon nitride ($Si_3N_4$), silicon oxynitride (SiON), boron-nitride (BN), silicon oxycarbide (SiOCN), boron-doped silicon oxycarbonitride (SiOCBN), aluminum oxide ($Al_2O_3$), silicon carbonitride (SiCN), silicon boronitride (SiBN), zirconium oxide ($ZrO_2$), hafnium oxide ($HfO_2$), or any combination thereof, with a thickness of between about 1 nm and about 2 nm. A total thickness of the bit line spacer 404 and the inner spacer layer 424 may be between about 4 nm and about 6 nm.

The interface layer 420 is formed of metal silicide, such as nickel silicide (NiSi), tungsten silicide ($WSi_2$), molybdenum silicide ($MoSi_2$), titanium silicide ($TiSi_2$), cobalt silicide ($CoSi_2$), tantalum silicide ($TaSi_2$), or any combination thereof, with a thickness of between about 5 nm and about 10 nm. The interface layer 420 provides an ohmic contact between the contact layer 418 and the metal plug 416.

Figure 5:
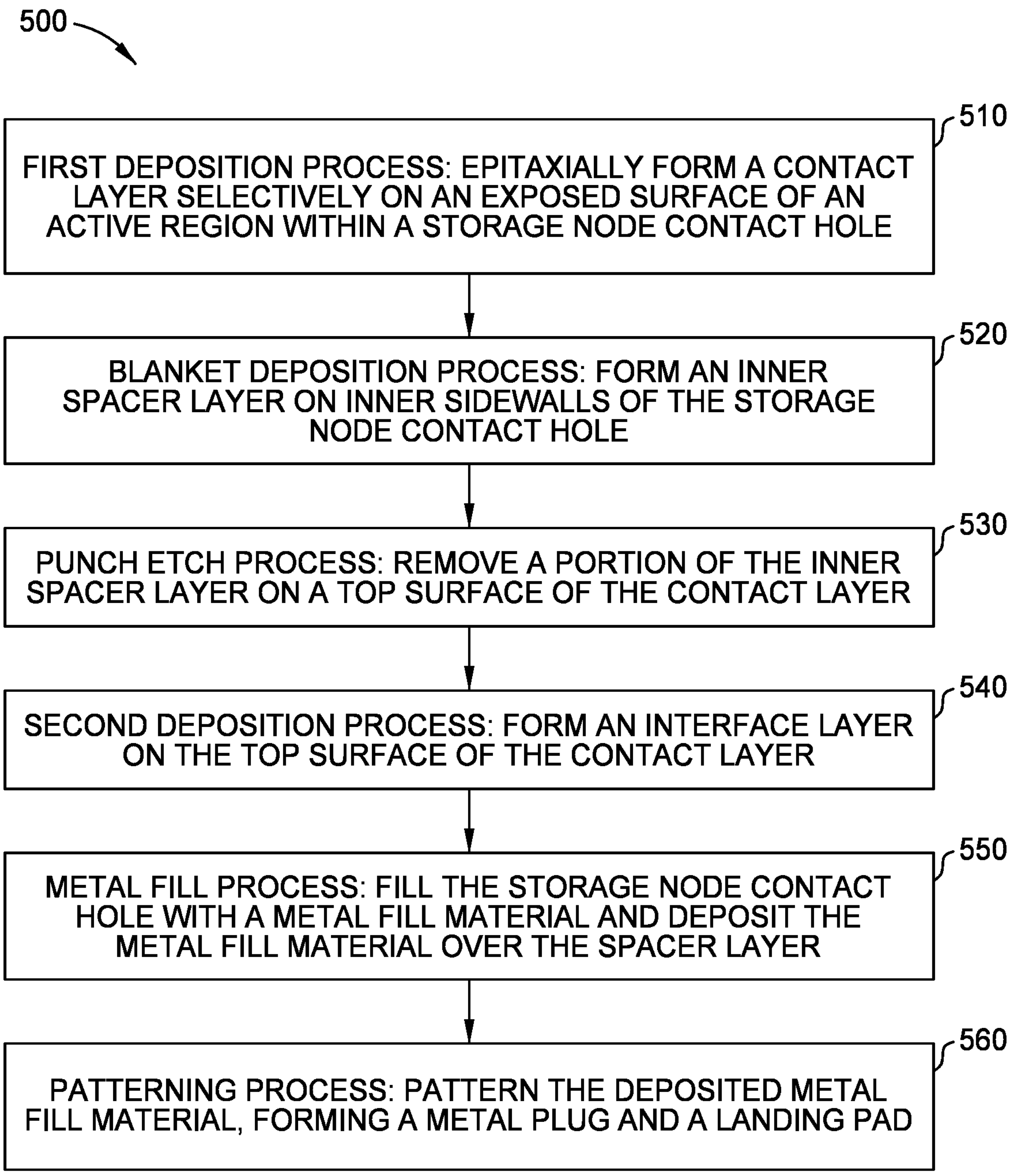
FIG. 5 depicts a process flow diagram of a method 500 of forming a storage node contact (SNC) in a semiconductor structure according to one embodiment.

FIG. 5 depicts a process flow diagram of a method 500 of forming a storage node contact (SNC) in a semiconductor structure 600 according to one or more implementations of the present disclosure. FIGS. 6A, 6B, 6C, 6D, 6E, and 6F schematically illustrate cross-sectional views of a portion of the semiconductor structure 600 at various stages of the method 500 to form the portion of the semiconductor structure 400 shown in FIG. 4B. It should be understood that FIGS. 6A, 6B, 6C, 6D, 6E, and 6F illustrate only partial schematic views of the semiconductor structure 600, and the semiconductor structure 600 may contain any number of transistor sections and additional materials having aspects as illustrated in the figures. It should also be noted that although the method illustrated in FIG. 5 is described sequentially, other process sequences that include one or more operations that have been omitted and/or added, and/or has been rearranged in another desirable order, fall within the scope of the embodiments of the disclosure provided herein. In the following description of FIGS. 6A, 6B, 6C, 6D, 6E, and 6F, the same reference numerals for the components that are used in FIGS. 4A and 4B are used and the description of repeated components may be omitted.

Figure 6A:
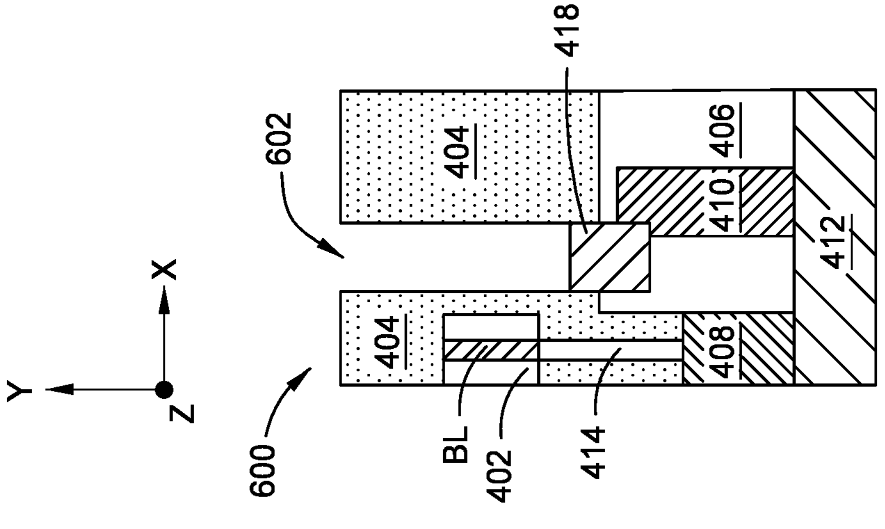
FIGS. 6A, 6B, 6C, 6D, 6E, and 6F are cross-sectional views of a portion of a semiconductor structure according to one embodiment.

As shown in FIG. 6A, the semiconductor structure 600 includes an insulating layer 406 and lightly n-type doped active regions 408 and 410 formed on a p-type doped substrate 412. The active region 408, the substrate 412, and another active region 410 aligned in the Z direction (not shown) form an access transistor Q in a memory cell M. A bit line BL contacts a bit line contact plug 414 formed through a spacer layer 404 to contact the active region 408. A storage node contact hole 602 may be formed through the spacer layer 404, prior to forming a storage node contact (SNC) by the method 500, using any suitable deposition technique, such as chemical vapor deposition (CVD), atomic layer deposition (ALD), or physical vapor deposition (PVD), and patterning technique, such as a lithography and etch process. The storage node contact hole 602 may have a depth of between about 70 nm and about 120 nm and a width of between about 7 nm and about 15 nm.

The method 500 begins with block 510, in which a first deposition process is performed to epitaxially form a contact layer 418 selectively on an exposed surface of the active region 410 within the storage node contact hole 602, as shown in FIG. 6A. The first deposition process in block 510 may be performed in a processing chamber, such as the processing chamber 126, 128, or 130 shown in FIG. 1, or the processing chamber 200 shown in FIG. 2.

The contact layer 418 may have a thickness of between about 15 nm and about 30 nm and a graded doping profile that increases in the Y direction from between about $10^{16}$ $cm^{-3}$ and about $10^{19}$ $cm^{-3}$ at an interface with the active region 410 to between about $10^{19}$ $cm^{-3}$ and about $10^{20}$ $cm^{-3}$ at a top surface of the contact layer 418. The dopants in the contact layer 418 are activated by a subsequent annealing process.

In the first deposition process, inner surfaces of the storage node contact hole 602 are exposed to a deposition gas containing silicon. Nucleation of silicon may occur at a faster rate on an exposed surface of the active region 410 (e.g., silicon) than on exposed surfaces of the spacer layer 404 (e.g., silicon nitride ($Si_3N_4$)), and thus the contact layer 418 may be formed selectively on the exposed surface of the active region 410 within the storage node contact hole 602. In some embodiments, the first deposition process includes an etch process to selectively etch an amorphous layer of silicon that may be formed on inner sidewalls of the storage node contact hole 602 and/or top surfaces of the spacer layer 404 (i.e., the exposed surfaces of the spacer layer 404), by an appropriate etching gas.

In some embodiments, the deposition gas includes a silicon-containing precursor and a dopant source. The silicon-containing precursor may include silane ($SiH_4$), disilane ($Si_2H_6$), tetrasilane ($Si_4H_{10}$), or a combination thereof. The dopant source may include a precursor phosphine ($PH_3$), phosphorus trichloride ($PCl_3$), triisobutylphosphine ([($CH_3$)$_3$C]$_3$P), arsine ($AsH_3$), arsenic trichloride ($AsCl_3$), tertiary-butylarsine ($AsC_4H_{11}$), antimony trichloride ($SbCl_3$), $Sb(C_2H_5)_5$. During the first deposition process, the dopant source may increase as the contact layer 418 grows to achieve the graded doping profile. The etching gas includes an etchant gas and a carrier gas. The etchant gas may include halogen-containing gas, such as hydrogen chloride (HCl), chlorine ($Cl_2$), or hydrogen fluoride (HF). The carrier gas may include nitrogen ($N_2$), argon (Ar), helium (He), or hydrogen ($H_2$).

A cycle of the epitaxial deposition process and the etch processes may be repeated as needed to obtain a desired thickness of the contact layer 418.

Figure 6B:
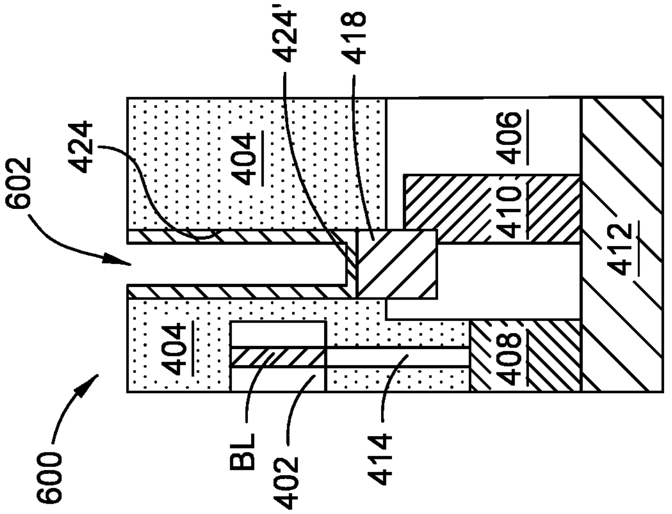

In block 520, a blanket deposition process is performed to form an inner spacer layer 424 on the inner surfaces of the storage node contact hole 602, as shown in FIG. 6B. The blanket deposition process in block 520 may include any appropriate deposition process, such as chemical vapor deposition (CVD), atomic layer deposition (ALD), physical vapor deposition (PVD), or the like, in a processing chamber, such as the processing chamber 126, 128, or 130 shown in FIG. 1.

The inner spacer layer 424 is formed of dielectric material, such as silicon nitride ($Si_3N_4$), silicon oxynitride (SiON), boron-nitride (BN), silicon oxycarbide (SiOCN), boron-doped silicon oxycarbonitride (SiOCBN), aluminum oxide ($Al_2O_3$), silicon carbonitride (SiCN), silicon boronitride (SiBN), zirconium oxide ($ZrO_2$), hafnium oxide ($HfO_2$), or any combination thereof, with a thickness of between about 1 nm and about 2 nm.

Figure 6C:
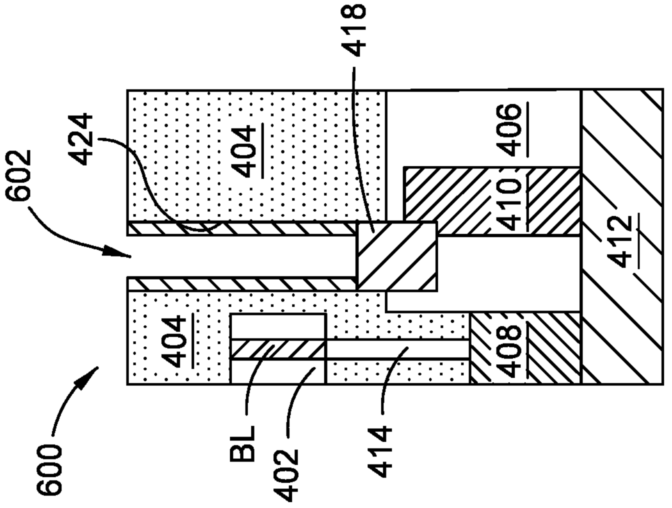

In block 530, a punch etch process is performed to remove a portion 424' of the inner spacer layer 424 on the top surface of the contact layer 418, as shown in FIG. 6C. The punch etch process in block 530 may include an anisotropic remote plasma assisted dry etch process, such as a reactive ion etching (RIE) process, in a processing chamber, such as the processing chamber 124 shown in FIG. 1, using a plasma formed from a gas including argon (Ar), helium (He), nitrogen ($N_2$), or a combination thereof. The plasma effluents directionally bombard and remove the portion 424' of the inner spacer layer 424.

Figure 6D:
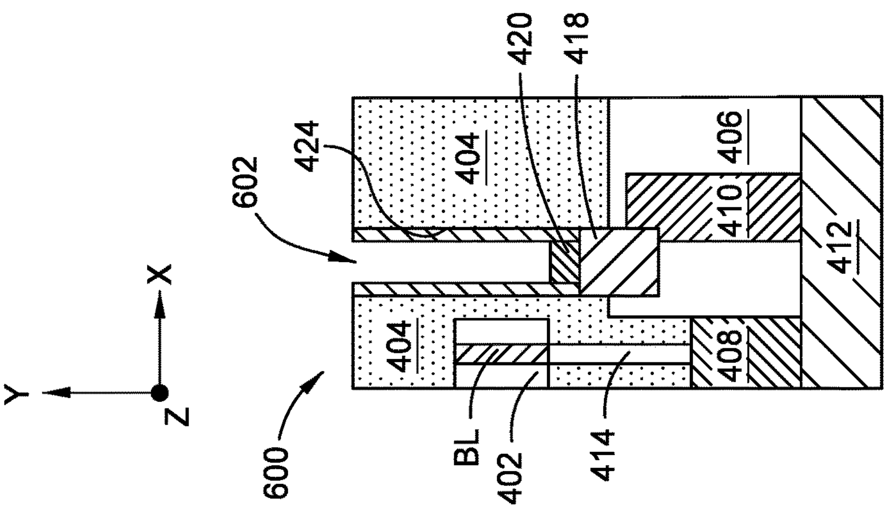

In block 540, a second deposition process is performed to form an interface layer 420 on the top surface of the contact layer 418, as shown in FIG. 6D. The second deposition process in block 540 may be performed in a processing chamber, such as the processing chamber 126, 128, or 130 shown in FIG. 1, or the processing chamber 200 shown in FIG. 2.

The interface layer 420 may be formed of metal silicide, such as nickel silicide (NiSi), tungsten silicide ($WSi_2$), molybdenum silicide ($MoSi_2$), titanium silicide ($TiSi_2$), cobalt silicide ($CoSi_2$), tantalum silicide ($TaSi_2$), or any combination thereof, with a thickness of between about 5 nm and about 10 nm. The interface layer 420 interfaces with the contact layer 418 and a metal plug to be formed within the storage node contact hole 602, and provides an electrical connection therebetween.

In the second deposition process, inner surfaces of the storage node contact hole 602 are exposed to a deposition gas containing a silicon-containing precursor and a metal source. The silicon-containing precursor may include silane ($SiH_4$), disilane ($Si_2H_6$), tetrasilane ($Si_4H_{10}$), or a combination thereof. The metal source may include a nickel (Ni), tungsten (W), molybdenum (Mo), titanium (Ti), cobalt (Co), or tantalum (Ta)-containing precursor.

The second deposition process in block 540 may include any appropriate deposition process, such as chemical vapor deposition (CVD), atomic layer deposition (ALD), physical vapor deposition (PVD), epitaxial deposition, or the like, in a processing chamber, such as the processing chamber 126, 128, or 130 shown in FIG. 1.

Figure 6E:
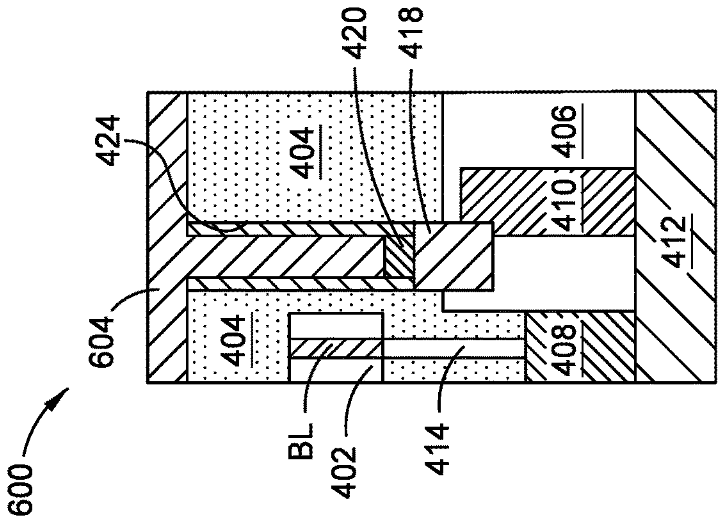

In block 550, a metal fill process is performed to fill the storage node contact hole 602 with a metal fill material 604 and deposit the metal fill material 604 over the spacer layer 404, as shown in FIG. 6E. The metal fill material 604 may be conductive material, such as tungsten (W), copper (Cu), cobalt (Co), titanium (Ti), molybdenum (Mo), nickel (Ni), ruthenium (Ru), silver (Ag), gold (Au), iridium (Ir), tantalum (Ta), or platinum (Pt), or conductive oxides or nitrides thereof, or any combination thereof. The metal fill process in block 550 may include any appropriate deposition process, such as chemical vapor deposition (CVD), atomic layer deposition (ALD), physical vapor deposition (PVD), or the like, in a processing chamber, such as the processing chamber 126, 128, or 130 shown in FIG. 1. In some embodiments, a pre-clean process is performed in a processing chamber, such as the processing chamber 122 shown in FIG. 1, prior to the metal fill process, to remove contaminants, such as carbon-containing contaminants (e.g., patterning residues), or oxide-containing contaminants (e.g., native oxide layers) formed on exposed surfaces within the storage node contact hole 602. In some embodiments, a liner layer (not shown) formed of titanium nitride (TiN) is deposited on exposed surfaces within the storage node contact hole 620, prior to the metal fill process.

Figure 6F:
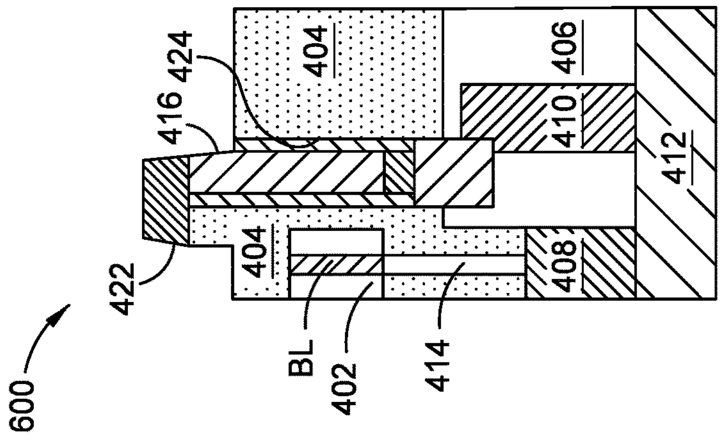

In block 560, a patterning process is performed to pattern the deposited metal fill material 604, forming a metal plug 416 and a landing pad 422, as shown in FIG. 6F. The patterning process in block 560 may include any patterning technique, such as a lithography and etch process in a processing chamber, such as the processing chamber 120, 122, or 124 shown in FIG. 1.

The embodiments described herein provide systems and methods for forming a storage node contact in DRAM devices. A storage node contact according to the embodiments described herein is formed of an epitaxially grown doped silicon and a metal plug and includes a dielectric spacer around the storage node contact to add thickness to a bit line spacer. Thus, the effective thickness of the bit line spacer is increased while maintaining a low resistance of the storage node contact. The bit line capacitance can be reduced with less stringent requirements of a bit line spacer dielectric constant and a bit line metal resistivity.

While the foregoing is directed to embodiments of the present disclosure, other and further embodiments of the disclosure may be devised without departing from the basic scope thereof, and the scope thereof is determined by the claims that follow.

The invention claimed is:

1. A semiconductor structure, comprising:

a first active region and a second active region on a substrate;

a metal plug electrically connected to the first active region via a contact layer and an interface layer;

a bit line electrically connected to the second active region via a bit line contact plug; and a bit line spacer encapsulating the bit line, wherein:

the first active region and the second active region are lightly n-type doped, the substrate is p-type doped, the contact layer is epitaxially grown and n-type doped with a graded doping profile that increases from an interface with the first active region to an interface with the interface layer, the first active region and the second active region are silicon doped with n-type dopants with concentration of between $10^{16}$ $cm^{-3}$ and $10^{19}$ $cm^{-3}$, and the graded doping profile of the contact layer increases from between $10^{16}$ $cm^{-3}$ and $10^{19}$ $cm^{-3}$ at the interface with the first active region to between $10^{19}$ $cm^{-3}$ and $10^{20}$ $cm^{-3}$ at the interface with the interface layer.

2. The semiconductor structure of claim 1, further comprising:

an inner spacer between the bit line spacer and the metal plug.

3. The semiconductor structure of claim 2, wherein the bit line spacer and the inner spacer comprise silicon nitride, and the inner spacer has a thickness of between 1 nm and 2 nm.

4. The semiconductor structure of claim 1, wherein the bit line comprises copper (Cu), cobalt (Co), tungsten (W), titanium (Ti), molybdenum (Mo), nickel (Ni), ruthenium (Ru), silver (Ag), gold (Au), iridium (Ir), tantalum (Ta), platinum (Pt), titanium silicide ($TiSi_2$), tungsten silicide ($WSi_2$), conductive oxides or nitrides thereof, or any combination thereof and has a width of between 5 nm and 10 nm.

5. The semiconductor structure of claim 1, wherein the bit line contact plug comprises polysilicon.

6. The semiconductor structure of claim 1, wherein the metal plug comprises tungsten (W), copper (Cu), cobalt (Co), titanium (Ti), molybdenum (Mo), nickel (Ni), ruthenium (Ru), silver (Ag), gold (Au), iridium (Ir), tantalum (Ta), or platinum (Pt), or conductive oxides or nitrides thereof, or any combination thereof and has a width of between 5 nm and 12 nm.

7. The semiconductor structure of claim 1, wherein the interface layer comprises nickel silicide (NiSi), tungsten silicide ($WSi_2$), molybdenum silicide ($MoSi_2$), titanium silicide ($TiSi_2$), cobalt silicide ($CoSi_2$), tantalum silicide ($TaSi_2$), or any combination thereof.

8. A method of forming a storage node contact in a semiconductor device, the method comprising:

performing a first deposition process to form a contact layer on an exposed surface of an active region within a storage node contact hole formed within a spacer, wherein a doping concentration of the contact layer is increased from an interface with the active region to a top surface of the contact layer;

performing a second deposition process to form an interface layer on the top surface of the contact layer;

performing a metal fill process to fill the storage node contact hole with a metal fill material and deposit the metal fill material over the interface layer; and performing a patterning process to pattern the deposited metal fill material, forming a metal plug that is electrically connected to the active region via the contact layer and the interface layer, and a landing pad overlapping with the metal plug, wherein:

the active region is silicon doped with n-type dopants with concentration of between $10^{16}$ $cm^{-3}$ and $10^{19}$ $cm^{-3}$, and the contact layer is silicon doped with n-type dopants with a graded doping profile that varies from between $10^{16}$ $cm^{-3}$ and $10^{19}$ $cm^{-3}$ at the interface with the active region to between $10^{19}$ $cm^{-3}$ and $10^{20}$ $cm^{-3}$ at the interface with the interface layer.

9. The method of claim 8, further comprising:

subsequent to the first deposition process and prior to the second deposition process, performing a blanket deposition process to form an inner spacer layer on inner surfaces of the storage node contact hole; and performing a punch etch process to remove a portion of the inner spacer layer on the top surface of the contact layer.

10. The method of claim 9, wherein:

the spacer and the inner spacer layer comprise silicon nitride, and the inner spacer layer has a thickness of between 1 nm and 2 nm.

11. The method of claim 8, wherein the metal plug comprises tungsten (W), copper (Cu), cobalt (Co), titanium (Ti), molybdenum (Mo), nickel (Ni), ruthenium (Ru), silver (Ag), gold (Au), iridium (Ir), tantalum (Ta), or platinum (Pt), or conductive oxides or nitrides thereof, or any combination thereof and has a width of between 5 nm and 12 nm.

12. The method of claim 8, wherein the interface layer comprises nickel silicide (NiSi), tungsten silicide ($WSi_2$), molybdenum silicide ($MoSi_2$), titanium silicide ($TiSi_2$), cobalt silicide ($CoSi_2$), tantalum silicide ($TaSi_2$), or any combination thereof.

13. A dynamic random-access memory (DRAM) device, comprising:

a plurality of memory cells, each of the plurality of memory cells comprising:

a bit line encapsulated in a bit line spacer;

a storage capacitor; and an access transistor having a first active region electrically connected to a storage node of the storage capacitor via a storage node contact and a second active region electrically connected to the bit line, wherein the storage node contact comprises:

an epitaxially grown contact layer n-type doped with a graded doping profile that increases from an interface with the first active region to a top surface of the contact layer;

an interface layer in contact with the top surface of the contact layer;

a metal plug in contact with the interface layer; and a landing pad in contact with the metal plug and the storage node of the storage capacitor, wherein:

the first active region and the second active region are silicon doped with n-type dopants with concentration of between $10^{16}$ $cm^{-3}$ and $10^{19}$ $cm^{-3}$ and the graded doping profile of the contact layer increases from between $10^{16}$ $cm^{-3}$ and $10^{19}$ $cm^{-3}$ at the interface with the first active region to between $10^{19}$ $cm^{-3}$ and $10^{20}$ $cm^{-3}$ at the interface with the interface layer.

14. The DRAM device of claim 13, wherein the bit line spacer comprises silicon nitride and has a thickness of between 4 nm and 6 nm.

15. The DRAM device of claim 13, wherein the bit line comprises copper (Cu), cobalt (Co), tungsten (W), titanium (Ti), molybdenum (Mo), nickel (Ni), ruthenium (Ru), silver (Ag), gold (Au), iridium (Ir), tantalum (Ta), platinum (Pt), titanium silicide ($TiSi_2$), tungsten silicide ($WSi_2$), conductive oxides or nitrides thereof, or any combination thereof and has a width of between 5 nm and 10 nm.

16. The DRAM device of claim 13, wherein the metal plug comprises tungsten (W), copper (Cu), cobalt (Co), titanium (Ti), molybdenum (Mo), nickel (Ni), ruthenium (Ru), silver (Ag), gold (Au), iridium (Ir), tantalum (Ta), or platinum (Pt), or conductive oxides or nitrides thereof, or any combination thereof and has a width of between 5 nm and 12 nm.

17. The DRAM device of claim 13, wherein the interface layer comprises nickel silicide (NiSi), tungsten silicide ($WSi_2$), molybdenum silicide ($MoSi_2$), titanium silicide ($TiSi_2$), cobalt silicide ($CoSi_2$), tantalum silicide ($TaSi_2$), or any combination thereof.

* * * * *